United States Patent
Forsnes et al.

(10) Patent No.: US 12,266,591 B2
(45) Date of Patent: *Apr. 1, 2025

(54) CHOKED FLOW COOLING

(71) Applicant: SK hynix NAND Product Solutions Corp., Rancho Cordova, CA (US)

(72) Inventors: Mark Forsnes, Folsom, CA (US); Yuhong Cai, Folsom, CA (US); Florence Pon, Folsom, CA (US); Yi Xu, Folsom, CA (US)

(73) Assignee: SK hynix NAND Product Solutions Corp., Rancho Cordova, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/421,728

(22) Filed: Jan. 24, 2024

(65) Prior Publication Data
US 2024/0170368 A1 May 23, 2024

Related U.S. Application Data

(63) Continuation of application No. 16/176,707, filed on Oct. 31, 2018, now Pat. No. 11,901,264.

(51) Int. Cl.
| | |
|---|---|
| *H01L 23/467* | (2006.01) |
| *H01L 23/04* | (2006.01) |
| *H01L 23/538* | (2006.01) |

(52) U.S. Cl.
CPC ............ *H01L 23/467* (2013.01); *H01L 23/04* (2013.01); *H01L 23/538* (2013.01)

(58) Field of Classification Search
None
See application file for complete search history.

(56) References Cited

U.S. PATENT DOCUMENTS 11,901,264 B2 * 2/2024 Forsnes ................ H01L 23/538

* cited by examiner

*Primary Examiner* — Benjamin P Sandvik
(74) *Attorney, Agent, or Firm* — Byrne Poh LLP

(57) ABSTRACT

Embodiments disclosed herein include electronic packages with chocked flow cooling. In an embodiment, an electronic package may comprise a package substrate, a die electrically and mechanically coupled to the package substrate, and a lid over the die. In an embodiment, the lid has a first opening and a second opening that is opposite from the first opening. In an embodiment, the electronic package may further comprise a coolant plate covering the first opening. In an embodiment, the coolant plate comprises a first surface facing away from the die and a second surface facing the die, and a plurality of vents from the first surface to the second surface. In an embodiment, the first openings of the plurality of vents have a first dimension and second openings of the plurality of vents have a second dimension that is smaller than the first dimension.

16 Claims, 7 Drawing Sheets

CHOKED FLOW COOLING

CROSS-REFERENCE TO RELATED APPLICATIONS

This application is a continuation of U.S. patent application Ser. No. 16/176,707, filed Oct. 31, 2018, which is hereby incorporated by reference herein in its entirety.

TECHNICAL FIELD

Embodiments of the present disclosure relate to electronic packaging, and more particularly, to a choked flow coolant plate for use in thermal management in electronic packages.

BACKGROUND

Thermal management is an important design parameter in electronic packages. As processing power continues to increase, advanced thermal solutions are needed in order to ensure that products function properly. Solid state drives (especially large solid state drives for server applications) are particularly problematic with regard to thermal management because they generate a lot of heat, and the maximum operating temperature of such drives is typically lower than the maximum operating temperature of the subcomponents, such as application specific integrated circuit (ASIC) controllers. For example, the maximum operating temperature of NAND flash memory components may be approximately 80° C., whereas the maximum operating temperature of ASIC controllers may be in excess of 100° C.

Current solutions for thermal management include heat sinks and thermal interface materials. In some instances external fans (e.g., fans at the rack level) may also be used to increase heat dissipation. However, as the density of memory components increases with miniaturization, the effectiveness of such thermal solutions are decreased.

EMBODIMENTS OF THE PRESENT DISCLOSURE

Figure 1:
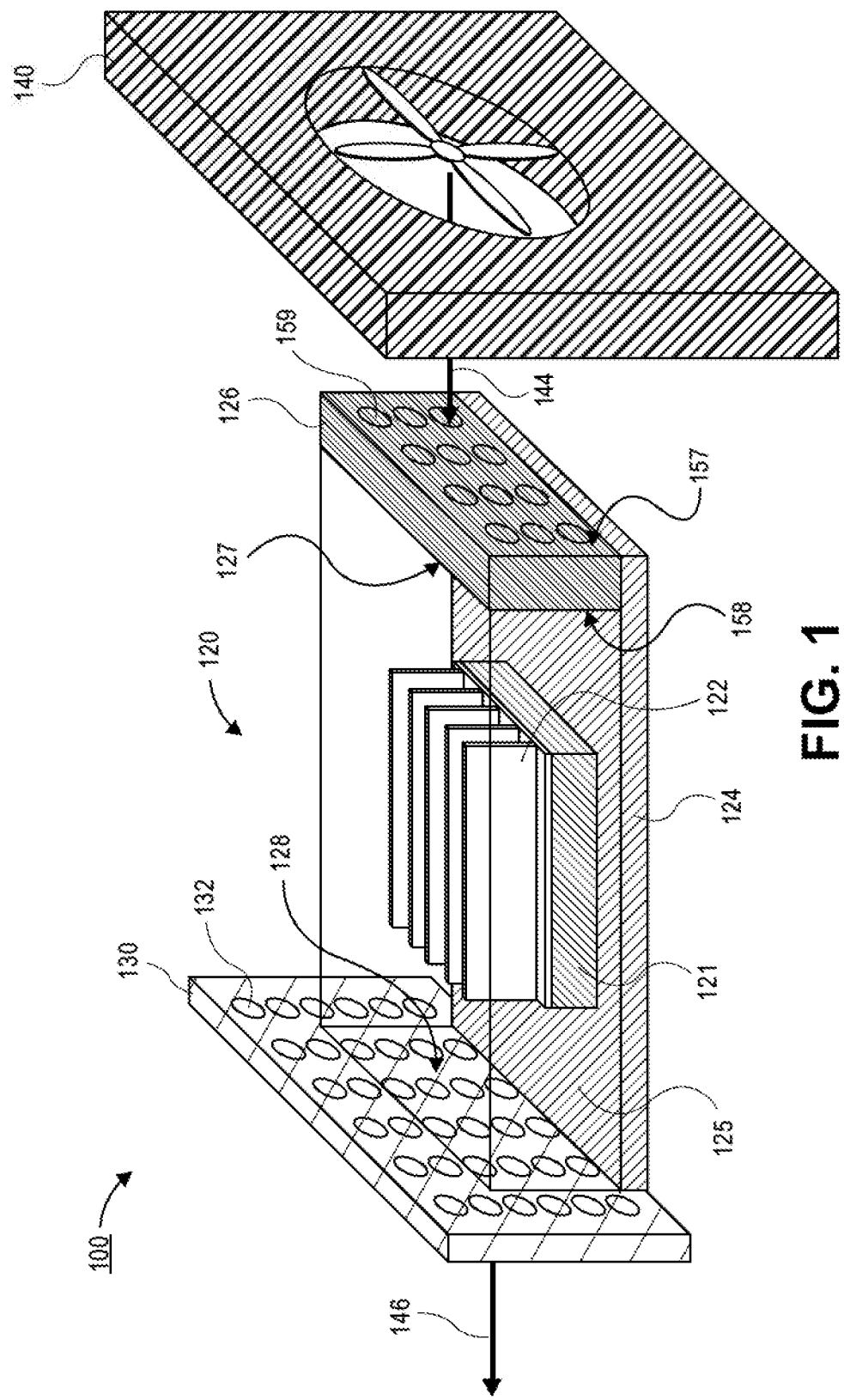
FIG. 1 is a perspective view of an electronic package with a choked flow coolant plate, in accordance with an embodiment.

Described herein are electronic packages with choked flow coolant plates for improving heat dissipation. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, thermal solutions presently available are not adequate for providing sufficient heat dissipation for high performance packages. Accordingly, embodiments disclosed herein include a coolant plate that is optimized for increasing the velocity of coolant that passes across the dies in the electronic package. Increasing the velocity of the coolant creates a wind chill effect that results in an increased effectiveness of the thermal solution used in the electronic package. For example, increasing the velocity of the coolant may result in an increased heat dissipation from a thermal solution such as a heat sink that is thermally coupled to the dies of the electronic package.

In some embodiments, the velocity of the coolant may be increased by providing vents with a first opening and a second opening. The first opening may have a larger dimension (e.g., diameter) than a dimension (e.g., diameter) of the second opening. The reduction in the dimension of the vent results in a choked flow condition. That is, as the coolant flows from the larger dimension first opening to the smaller dimension second opening, the velocity of the coolant is increased.

As noted above, improved thermal solutions are needed for high density memory packages due to their lower maximum operating temperatures (e.g., 80° C.) and the large amount of heat that the memory dies generate. Accordingly, it is to be appreciated that in some embodiments disclosed herein, the electronic packages may refer to electronic packages with memory dies (e.g., NAND, NOR, or the like). However, embodiments are not limited to memory packages. For example, coolant plates such as those described herein may also be applicable to thermal solutions for electronic packages that include processors, graphics processing units (GPUs), or any other electronic package.

Referring now to FIG. 1, a perspective view illustration of an electronic system 100 is shown, in accordance with an embodiment. In an embodiment, the electronic system 100 comprises one or more electronic packages 120. For example, a plurality of electronic packages 120 may be assembled in a rack (e.g., a server rack) or the like. Each electronic package 120 may comprise a package substrate 124 on which one or more dies 121 are packaged. In the illustrated embodiment, a single die 121 is shown, but it is to be appreciate that any number of dies 121 may be electrically and mechanically coupled to the package substrate 124. In an embodiment, the die 121 may be a solid state drive (e.g., NAND, NOR, or the like).

In an embodiment, a thermal solution 122 may be coupled to the die 121. The thermal solution may include one or more of a thermal interface material, a heatsink, or the like. For example, in FIG. 1 the thermal solution 122 is shown as a heatsink with a plurality of fins. In an embodiment, the thermal solution 122 may also comprise a lid 125 that is formed over the die 121. The lid 125 may be a material with a high thermal conductivity. In some embodiments, the lid 125 may be coupled to the thermal solution 122.

In an embodiment, the lid 125 may form an enclosure around opposing sidewalls of the die 121 and over a top surface of the die 121. The lid 125 may also have a first opening 127 and a second opening 128 opposite from the first opening 127. In an embodiment, coolant 144 (e.g., from an external fan 140 or any other source) may enter the electronic package through the first opening 127 and pass over the thermal solution 122. Coolant 146 may exit the electronic package 120 out the second opening 128. In an embodiment, the coolant 144 may be a gas (e.g., air) or the coolant 144 may be a liquid (e.g., water).

In an embodiment, a coolant plate 126 may cover the first opening 127. As shown, the coolant plate 126 is illustrated as a separate component from the lid 125. However, in some embodiments the coolant plate 126 may form a portion of the lid 125. In an embodiment, the coolant plate 126 includes a first surface 157 and a second surface 158 opposite from the first surface. The first surface 157 faces away from the die 121 and the second surface 158 faces the die 121. In an embodiment a plurality of vents 159 may be formed in the coolant plate 126. The vents 159 may extend from the first surface 157 through the coolant plate 126 to the second surface 158. As will be described in greater detail below, the vents 159 may comprise a non-uniform dimension (e.g., a first dimension at the first surface 157 that is larger than a second dimension at the second surface 158) that provides a choked flow condition. Accordingly, coolant 144 passing through the coolant plate 126 is accelerated, and the effectiveness of the thermal solution 122 is increased. In some embodiments, the second opening 128 may be covered by a second coolant plate 130 with vents 132.

Figure 2A:
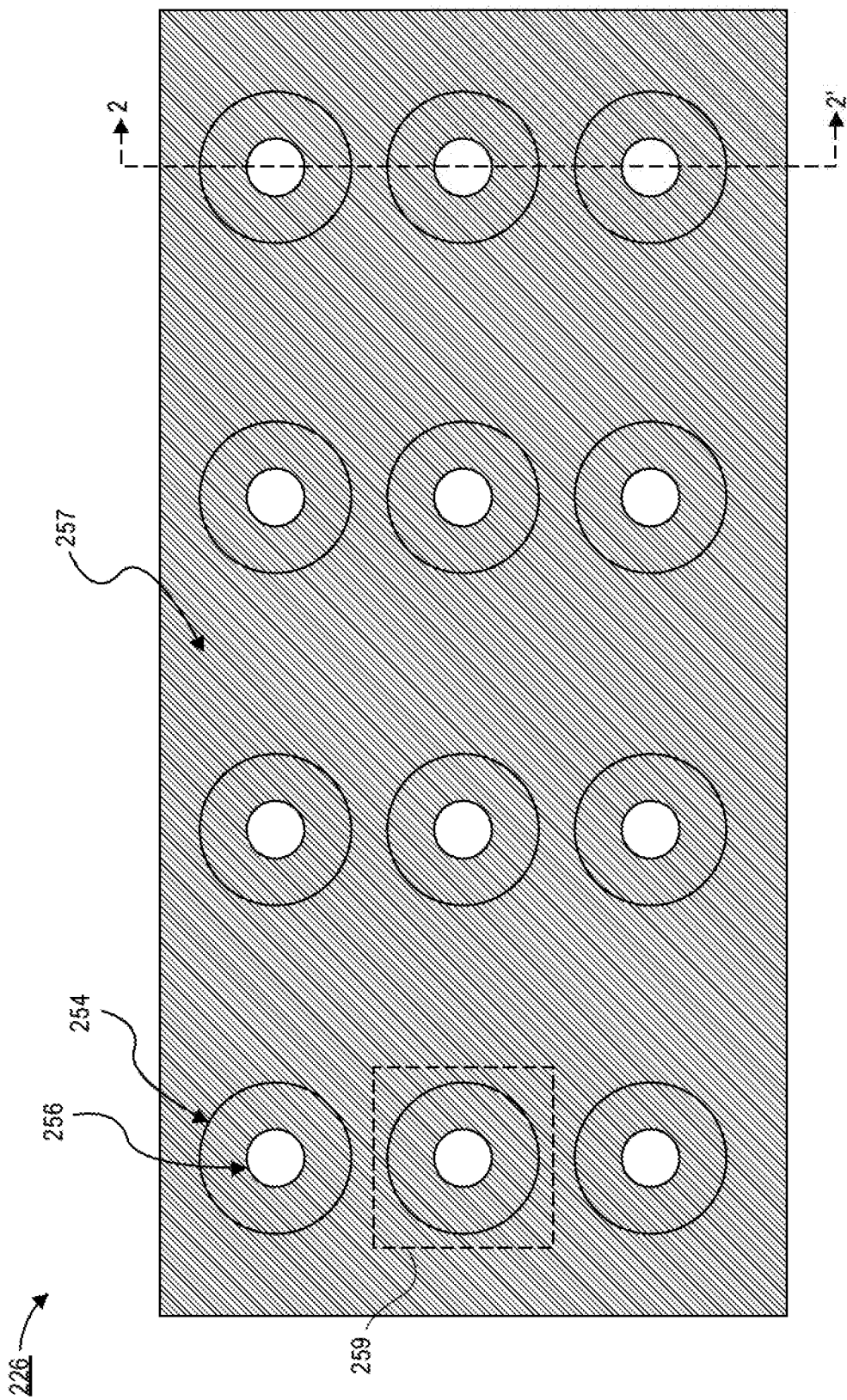
FIG. 2A is a plan view illustration of a choked flow coolant plate, in accordance with an embodiment.

Referring now to FIG. 2A, a plan view illustration of a coolant plate 226 is shown, in accordance with an embodiment. In the illustrated embodiment, the first surface 257 is shown. As shown, a plurality of vents 259 are formed through the coolant plate 226. The vents 259 may each comprise a first opening 254 with a first dimension and a second opening 256 with a second dimension. As shown in FIG. 2A, the first openings 254 and the second openings 256 are substantially concentric circles with different diameters. However, it is to be appreciated that the vents 259 may have openings with any desired shape (e.g., rectangular, square, elliptical, etc.). While a three by four arrangement of vents 259 is shown, it is to be appreciated that any number of vents 259 in any configuration and/or spacing may be used to provide the desired coolant flow.

Figure 2C:
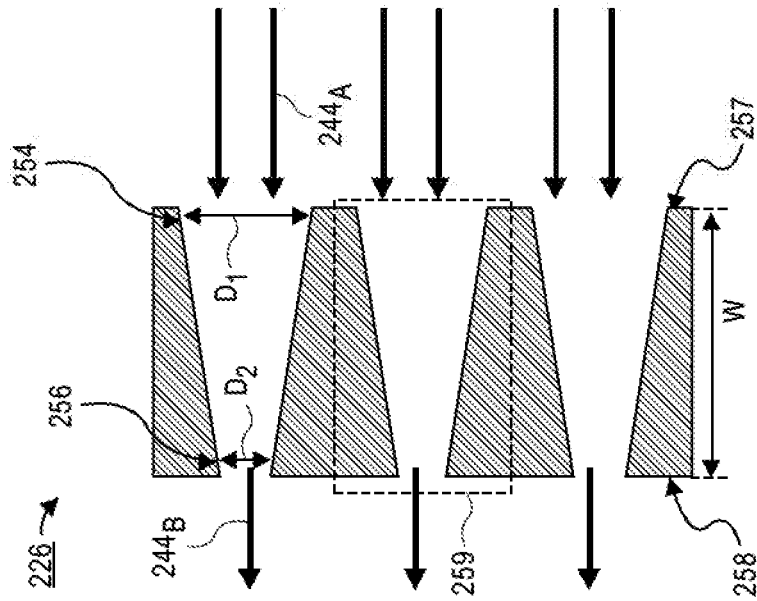
FIG. 2C is a cross-sectional illustration of the choked flow coolant plate, in accordance with an additional embodiment.
Figure 2B:
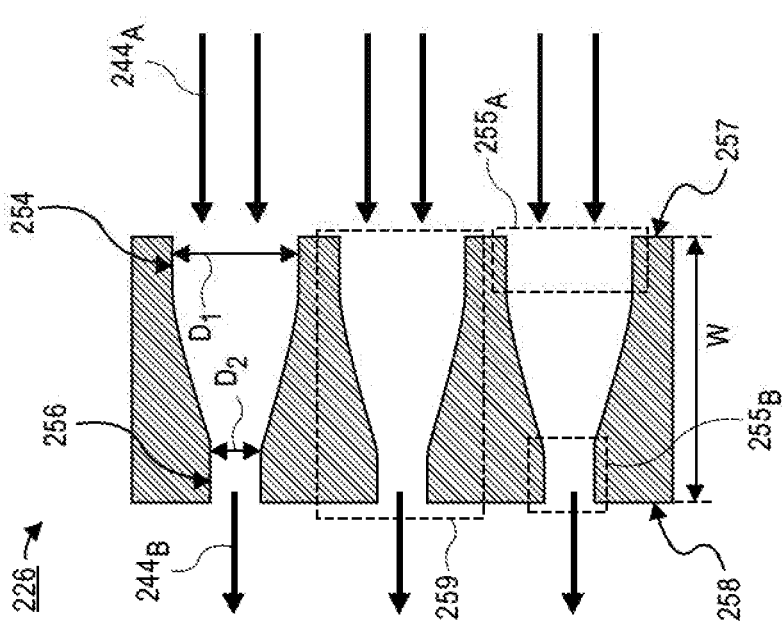
FIG. 2B is a cross-sectional illustration of the choked flow coolant plate, in accordance with an embodiment.

Referring now to FIGS. 2B and 2C, cross-sectional illustrations of the coolant plate in FIG. 2A along line 2-2' are shown, in accordance with various embodiments.

Referring now to FIG. 2B, the cross-sectional illustration depicts the shape of the vents 259 as they pass from the first surface 257 to the second surface 258. As shown, the first openings 254 at the first surface have a first dimension $D_1$ and the second openings 256 at the second surface has a second dimension $D_2$. In embodiments where the openings are circular (as viewed in the plan view shown in FIG. 2A), the first dimension $D_1$ and the second dimension $D_2$ may be diameters. In an embodiment, the second dimension $D_2$ is smaller than the first dimension $D_1$. For example, the second dimension $D_2$ may be half of the first dimension $D_1$ or less. In an embodiment, the first dimension $D_1$ may be approximately 10 mm, and the second dimension $D_2$ may be approximately 5 mm. In an embodiment, the width W of the coolant plate 226 may be between approximately 1 inch and 2.5 inches.

In some embodiments, the reduction of the dimension of the vents 259 from the first dimension $D_1$ to the second dimension $D_2$ may be reached before the vents 259 exit the coolant plate 226 at the second surface 258. For example, stem regions $255_A$ may have a substantially uniform dimension. That is, the entire stem region 255B may have a dimension that is substantially equal to the second dimension $D_2$. Similarly, in some embodiments, the vents 259 may have stem regions $255_A$ proximate to the first surface 257 that remain at the first dimension $D_1$ as the vent extends into the coolant plate 226. In the illustrated embodiment, the portions of the vents 259 between the stems $255_A$ and $255_B$ are shown as being substantially decreasing in dimension. However, it is to be appreciated that the vents 259 may conform to any desired profile where the first openings 254 have a first dimension $D_1$ that is greater than a second dimension $D_2$ of the second openings 256.

As shown in FIG. 2B, coolant $244_A$ enters the first openings 254 and coolant $244_B$ exits the second openings 256. Due to the reduction in the dimensions (i.e., the reduction from the first dimension $D_1$ to the second dimension $D_2$), the coolant $244_B$ that exits the vents 259 will have a greater velocity than the coolant $244_A$ that enters the vents 259. The increase in the velocity of the coolant $244_B$ relative to coolant $244_A$ may be proportional to the difference between the first dimension $D_1$ and the second dimension $D_2$. For example, when the second dimension $D_2$ is half of the first dimension $D_1$, the velocity of the coolant $244_B$ may be twice the velocity of the coolant $244_A$. Accordingly, embodiments disclosed herein allow for improved efficiency of the thermal solution of the electronic package due to the wind chill effect produced by the increased velocity of the coolant.

Referring now to FIG. 2C, a cross-sectional illustration of a coolant plate 226 with vents that have a different profile is shown, in accordance with an embodiment. In an embodiment, the coolant plate 226 in FIG. 2C may be substantially similar to the coolant plate in FIG. 2B, with the exception that the stems $255_A$ and $255_B$ are omitted. That is, the profile of the vents 259 include a continuously decreasing dimension. For example, at the first surface 257 the first openings 254 may have a first dimension $D_1$ and the dimension of the vents 259 does not reach the second dimension until the second opening 256 at the second surface 258.

Figure 3A:
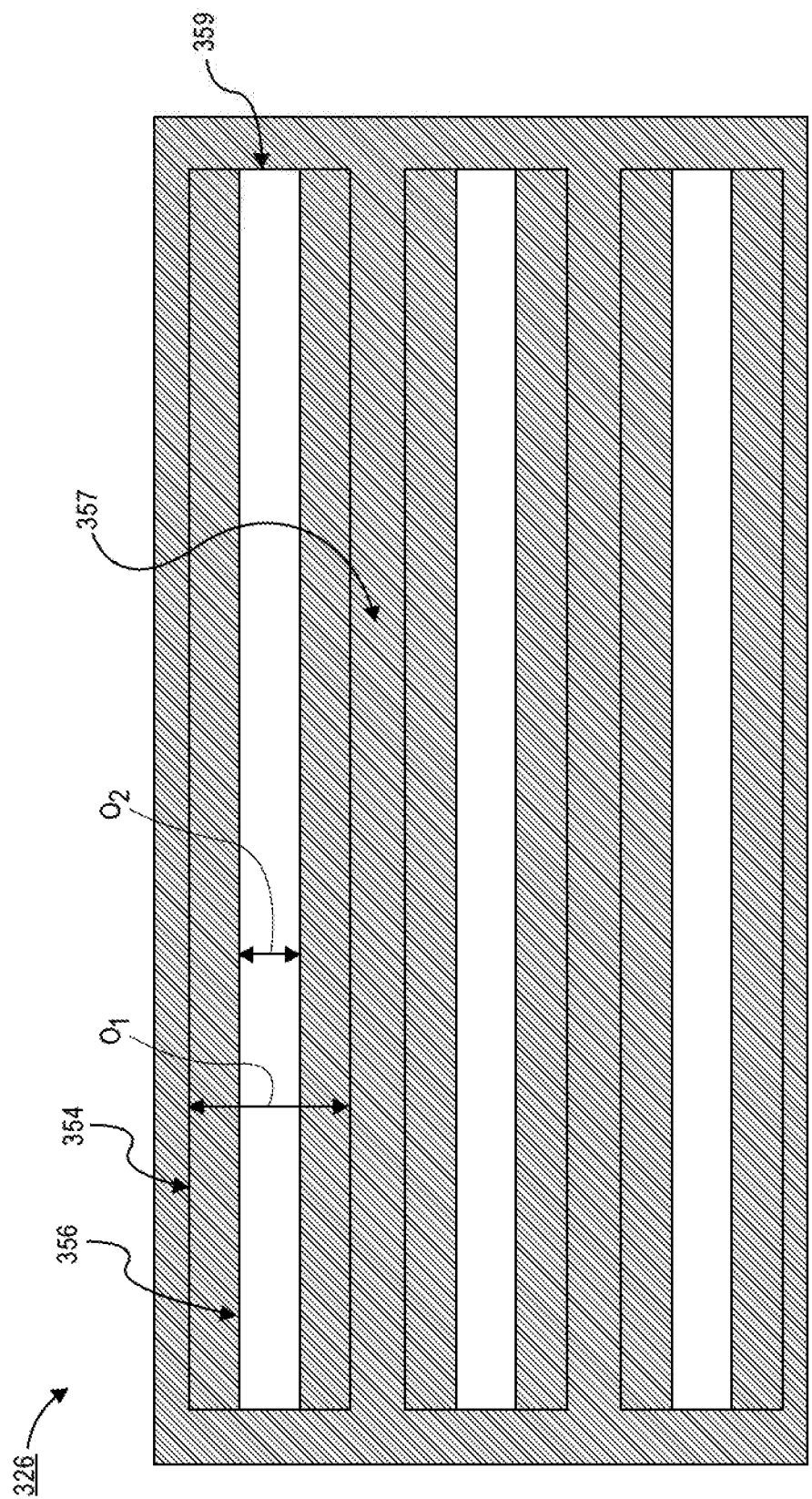
FIG. 3A is a plan view illustration of a choked flow coolant plate with horizontal openings, in accordance with an embodiment.

Referring now to FIG. 3A, a plan view illustration of a coolant plate 326 is shown, in accordance with an additional embodiment. In the illustrated embodiment, the vents 359 have a rectangular shape. For example, the first openings 354 on the first surface 357 may extend longitudinally across the coolant plate 326. The first openings 354 may have a first opening dimension $O_1$. In an embodiment, the second openings 356 may have a second opening dimension $O_2$ that is smaller than the first opening dimension $O_1$. In the illustrated embodiment, the first openings 354 and the second openings 356 are shown as having the same width (e.g., in the X-direction). However, it is to be appreciated that the width of the second openings 356 may be smaller than the width of the first openings 354.

Figure 3B:
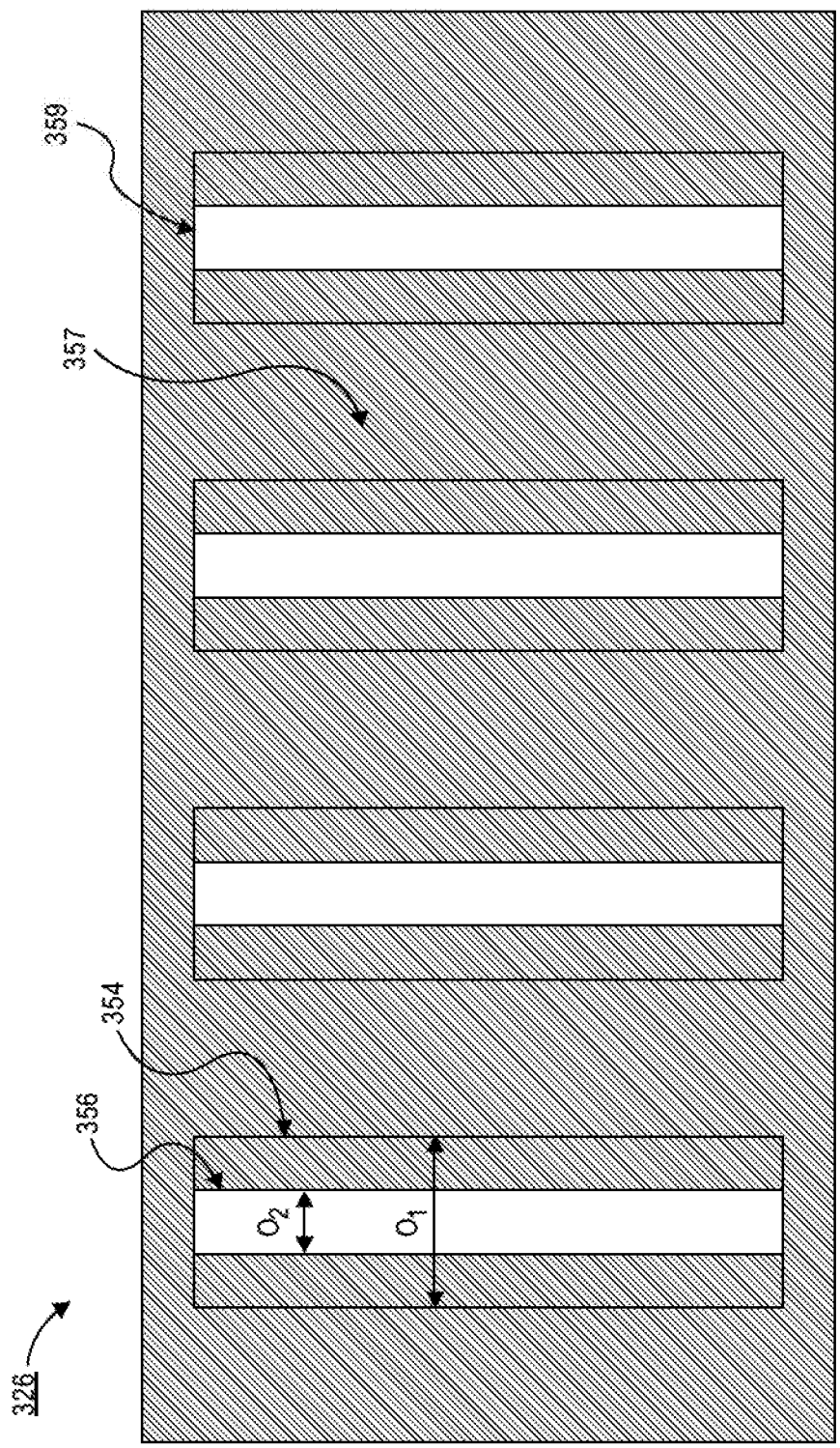
FIG. 3B is a plan view illustration of a choked flow coolant plate with vertical openings, in accordance with an embodiment.

Referring now to FIG. 3B, a plan view illustration of a coolant plate 326 is shown, in accordance with an additional embodiment. In the illustrated embodiment, the vents 359 have a rectangular shape. For example, the first openings 354 on the first surface 357 may extend vertically across the coolant plate 326. The first openings 354 may have a first opening dimension $O_1$. In an embodiment, the second openings 356 may have a second opening dimension $O_2$ that is smaller than the first opening dimension $O_1$. In the illustrated embodiment, the first openings 354 and the second openings 356 are shown as having the same height (e.g., in the Y-direction). However, it is to be appreciated that the height of the second openings 356 may be smaller than the height of the first openings 354.

Figure 4:
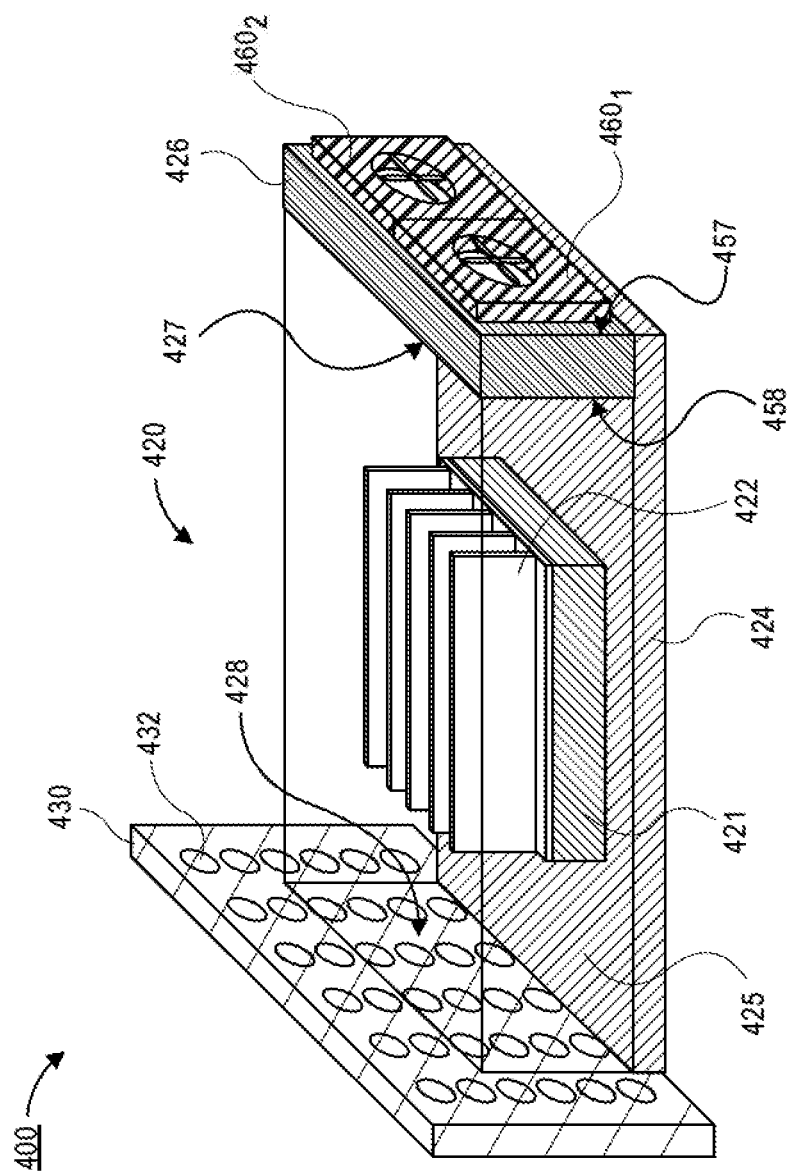
FIG. 4 is a perspective view illustration of an electronic package with a choked flow coolant plate and a plurality of local fans to improve coolant flow, in accordance with an embodiment.

Referring now to FIG. 4, a perspective view illustration of an electronic system 400 with electronic packages 420 with integrated fan systems 460 is shown, in accordance with an embodiment. In an embodiment, the electronic system 400 comprises one or more electronic packages 420. For example, a plurality of electronic packages 420 may be assembled in a rack (e.g., a server rack) or the like. Each electronic package 420 may comprise a package substrate 424 on which one or more dies 421 are packaged. In the illustrated embodiment, a single die 421 is shown, but it is to be appreciate that any number of dies 421 may be electrically and mechanically coupled to the package substrate 424. In an embodiment, the die 421 may be a solid state drive (e.g., NAND, NOR, or the like).

In an embodiment, a thermal solution 422 may be coupled to the die 421. The thermal solution may include one or more of a thermal interface material, a heatsink, or the like. For example, in FIG. 4 the thermal solution 422 is shown as a heatsink with a plurality of fins. In an embodiment, the thermal solution 422 may also comprise a lid 425 that is formed over the die 421. The lid 425 may be a material with a high thermal conductivity. In some embodiments, the lid 425 may be coupled to the thermal solution 422.

In an embodiment, the lid 425 may form an enclosure around opposing sidewalls of the die 421 and over a top surface of the die 421. The lid 425 may also have a first opening 427 and a second opening 428 opposite from the first opening 427. In an embodiment, coolant (not shown) may enter the electronic package through the first opening 427 and pass over the thermal solution 422. Coolant may exit the electronic package 420 out the second opening 428. In an embodiment, the coolant may be a gas (e.g., air) or the coolant may be a liquid (e.g., water).

In an embodiment, a coolant plate 426 may cover the first opening 427. As shown, the coolant plate 426 is illustrated as a separate component from the lid 425. However, in some embodiments the coolant plate 426 may form a portion of the lid 425. In an embodiment, the coolant plate 426 includes a first surface 457 and a second surface 458 opposite from the first surface. The first surface 457 faces away from the die 421 and the second surface 458 faces the die 421. In an embodiment a plurality of vents may be formed in the coolant plate 426. In the illustrated embodiment, the vents are hidden by fans 460. The vents may extend from the first surface 457 through the coolant plate 426 to the second surface 458. In an embodiment, the vents may comprise a non-uniform dimension (e.g., a first dimension at the first surface 457 that is larger than a second dimension at the second surface 458) that provides a choked flow condition. In an embodiment, the vents may be substantially similar to vents 259 and 359 described above with respect to FIGS. 2A-3B. Accordingly, coolant passing through the coolant plate 426 is accelerated, and the effectiveness of the thermal solution 422 is increased. In some embodiments, the second opening 428 may be covered by a second coolant plate 430 with vents 432.

In an embodiment, the electronic package 420 may further comprise an integrated fan system 460. For example, a plurality of fans (e.g., fans 460₁ and 460₂) may be affixed to the coolant plate 426. While two fans 460₁ and 460₂ are shown, it is to be appreciated that any number of fans 460 may be integrated with the electronic package 420. For example, a single fan 460 or more than two fans 460 may be used. In a particular embodiment, the number of fans 460 may be equal to the number of vents. That is, each vent may be associated with its own fan 460 in order to provide improved coolant flow into the electronic package 420.

In an embodiment, the fans 460 may be mechanically coupled to the first surface 457 of the coolant plate 426. In other embodiments, the fans 460 may be supported by a portion of the package substrate 424.

Figure 5:
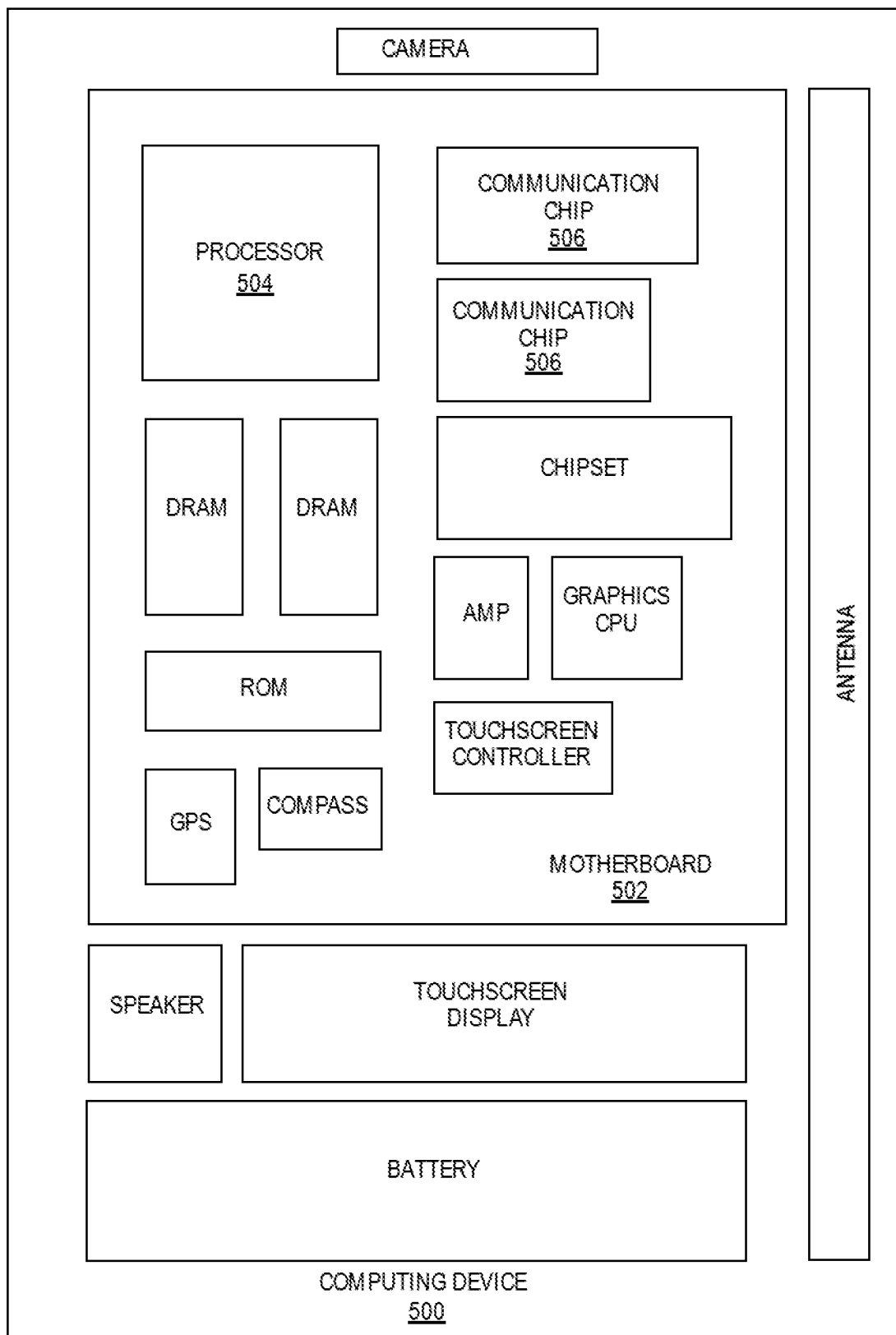
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be packaged in an electronic package that comprises a coolant plate with vents that have a non-uniform dimension, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be packaged in an electronic package that comprises a coolant plate with vents that have a non-uniform dimension, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a die electrically and mechanically coupled to the package substrate; a lid over the die, wherein the lid has a first opening and a second opening that is opposite from the first opening; and a coolant plate covering the first opening, wherein the coolant plate comprises a first surface facing away from the die and a second surface facing the die, and a plurality of vents from the first surface to the second surface, wherein first openings of the plurality of vents have a first dimension and second openings of the plurality of vents have a second dimension that is smaller than the first dimension.

Example 2: the electronic package of Example 1, wherein the first dimension is a diameter and the second dimension is a diameter.

Example 3: the electronic package of Example 1 or Example 2, wherein the second dimension is half the first dimension or less.

Example 4: the electronic package of Examples 1-3, wherein the vents have a continuously decreasing dimension from the first surface to the second surface.

Example 5: the electronic package of Examples 1-4, wherein a decrease of the dimension of the vents from the first dimension to the second dimension is reached before the second surface.

Example 6: the electronic package of Examples 1-5, further comprising: a fan attached to the coolant plate.

Example 7: the electronic package of Examples 1-6, further comprising: a thermal solution attached to the die.

Example 8: the electronic package of Examples 1-7, wherein the thermal solution comprises cooling fins.

Example 9: the electronic package of Examples 1-8, wherein the cooling fins contact the lid.

Example 10: the electronic package of Examples 1-9, further comprising: a plurality of dies electrically and mechanically coupled to the package substrate.

Example 11: the electronic package of Examples 1-10, wherein the die is a memory die.

Example 12: the electronic package of Examples 1-11, wherein the memory die is a NAND device.

Example 13: the electronic package of Examples 1-12, wherein the die is a graphics processor unit (GPU).

Example 14: a coolant plate for an electronic package, comprising: a first surface; a second surface opposite from the first surface; and a plurality of vents from the first surface to the second surface, the vents having a first opening at the first surface with a first dimension and a second opening at the second surface with a second dimension that is smaller than the first dimension.

Example 15: the coolant plate of Example 14, wherein the vents have a substantially circular shape.

Example 16: the coolant plate of Example 14 or Example 15, wherein the first dimension is a diameter and the second dimension is a diameter.

Example 17: the coolant plate of Examples 14-16, wherein the vents have a substantially rectangular shape.

Example 18: the coolant plate of Examples 14-17, wherein the second dimension is half the first dimension or less.

Example 19: the coolant plate of Examples 14-18, wherein the coolant plate is part of a lid for an electronic package.

Example 20: the coolant plate of Examples 14-19, further comprising a plurality of fans attached to the first surface of the coolant plate.

Example 21: the coolant plate of Examples 14-20, wherein the vents have a continuously decreasing dimension from the first surface to the second surface.

Example 22: the coolant plate of Examples 14-21, wherein a decrease of the dimension of the vents from the first dimension to the second dimension is reached before the second surface.

Example 23: an electronic package, comprising: a package substrate; a die coupled to the package substrate; a thermal solution on the die; a lid over the die, wherein the lid has a first opening and a second opening opposite the first opening; and a coolant plate covering the first opening, wherein the coolant plate comprises a plurality of vents with a non-uniform cross-section.

Example 24: the electronic package of Example 23, wherein the vents comprise first openings with a first diameter and second openings with a second diameter.

Example 25: the electronic package of Example 23 or Example 24, wherein the second diameter is half the first diameter or less.

What is claimed is:

1. An apparatus for cooling a die, comprising:
   a lid over configured to be positioned over the die, wherein the lid has a first opening and a second opening that is opposite from the first opening and wherein air flows from the first opening to the second opening; and
   a plate partially closing the first opening, wherein the plate comprises a first surface facing away from the die, a second surface facing the die, and a plurality of vents extending from the first surface to the second surface, wherein first openings of the plurality of vents have a first dimension and second openings of the plurality of vents have a second dimension that is smaller than the first dimension, and
   wherein, when the lid is positioned over a structure containing the die and the plate is partially closing the first opening, all of the air that flows from the first opening to the second opening flows through the plurality of vents in the plate partially closing the first opening.

2. The apparatus of claim 1, wherein the first dimension is a diameter and the second dimension is a diameter.

3. The apparatus of claim 2, wherein the second dimension is half the first dimension or less.

4. The apparatus of claim 1, wherein the vents have a continuously decreasing dimension from the first surface to the second surface.

5. The apparatus of claim 1, wherein a decrease of the dimension of the vents from the first dimension to the second dimension is reached before the second surface.

6. The apparatus of claim 1, further comprising:
a fan attached to the plate.

7. The apparatus of claim 1, further comprising:
a thermal solution configured to be attached to the die.

8. The apparatus of claim 7, wherein the thermal solution comprises cooling fins.

9. The apparatus of claim 8, wherein the cooling fins contact the lid.

10. The apparatus of claim 1, wherein the die is a memory die.

11. The apparatus of claim 10, wherein the memory die is a NAND device.

12. The apparatus of claim 1, wherein the die is a graphics processor unit (GPU).

13. The apparatus of claim 1, wherein the vents have a substantially circular cross-sectional shape.

14. The apparatus of claim 1, wherein the vents have a substantially rectangular cross-sectional shape.

15. The apparatus of claim 1, wherein the plate is part of the lid.

16. The apparatus of claim 1, further comprising a plurality of fans attached to the first surface of the plate.

* * * * *